(12) United States Patent
Lee et al.

(10) Patent No.: US 11,705,546 B2
(45) Date of Patent: Jul. 18, 2023

(54) DISPLAY APPARATUS

(71) Applicant: Samsung Display Co., Ltd., Yongin-si (KR)

(72) Inventors: Junhee Lee, Yongin-si (KR); Yeongho Lee, Yongin-si (KR); Chanyoung Kim, Yongin-si (KR); Chiwook An, Yongin-si (KR); Choongyoul Im, Yongin-si (KR); Dayoung Jung, Yongin-si (KR); Seongmin Cho, Yongin-si (KR); Miran Ji, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 151 days.

(21) Appl. No.: 17/098,145

(22) Filed: Nov. 13, 2020

(65) Prior Publication Data

US 2021/0359181 A1    Nov. 18, 2021

(30) Foreign Application Priority Data

May 13, 2020    (KR) .......................... 10-2020-0057189

(51) Int. Cl.
*H01L 33/62* (2010.01)
*H01L 33/56* (2010.01)
*H01L 25/075* (2006.01)

(52) U.S. Cl.
CPC .......... *H01L 33/62* (2013.01); *H01L 25/0753* (2013.01); *H01L 33/56* (2013.01); *H01L 2924/15151* (2013.01); *H01L 2924/3641* (2013.01)

(58) Field of Classification Search
CPC ... H01L 2924/3641; H01L 2924/15151; H01L 33/62; H01L 25/0753; H01L 33/56
See application file for complete search history.

(56) References Cited

U.S. PATENT DOCUMENTS

| 7,576,482 | B2 | 8/2009 | Oh |
| 9,589,903 | B2 | 3/2017 | Chen et al. |
| 9,812,518 | B2 | 11/2017 | Kim |
| 10,170,534 | B1* | 1/2019 | Kim ................... H01L 27/3223 |
| 10,551,877 | B2 | 2/2020 | Park et al. |
| 2019/0006442 | A1* | 1/2019 | Byun ................. H01L 27/3246 |

(Continued)

FOREIGN PATENT DOCUMENTS

| KR | 10-0683791 B1 | 2/2007 |
| KR | 10-2016-0120388 A | 10/2016 |

(Continued)

*Primary Examiner* — Feifei Yeung Lopez
(74) *Attorney, Agent, or Firm* — Lewis Roca Rothgerber Christie LLP

(57) ABSTRACT

A display apparatus includes a substrate having a display area and a peripheral area surrounding the display area, a first initialization voltage line on the substrate, an organic film layer on the first initialization voltage line and having a first contact hole exposing at least a portion of the first initialization voltage line, and a bridge wiring on the organic film layer corresponding to the peripheral area, and in contact with the first initialization voltage line through the first contact hole, wherein the organic film layer corresponding to the peripheral area has a groove or dummy hole, each of the groove and the dummy hole being adjacent to the first contact hole.

20 Claims, 10 Drawing Sheets

(56) References Cited

U.S. PATENT DOCUMENTS

2019/0237533 A1    8/2019   Kim et al.
2020/0006452 A1    1/2020   Lee et al.

FOREIGN PATENT DOCUMENTS

| KR | 10-2019-0016171 A | 2/2019 |
| KR | 10-1962508 B1 | 3/2019 |
| KR | 10-2019-0093228 A | 8/2019 |
| KR | 10-2020-0003955 A | 1/2020 |

* cited by examiner

DISPLAY APPARATUS

CROSS-REFERENCE TO RELATED APPLICATION

This application claims priority to and the benefit of Korean Patent Application 10-2020-0057189, filed on May 13, 2020, in the Korean Intellectual Property Office, the disclosure of which is incorporated by reference herein in its entirety.

BACKGROUND

1. Field

One or more embodiments relate to display apparatuses.

2. Description of Related Art

In general, a display apparatus has a configuration in which various layers are stacked. For example, an organic light-emitting display apparatus includes an organic light-emitting device, which includes a pixel electrode, an intermediate layer including an organic emission layer, and a counter electrode. In addition, a circuit unit for driving the organic light-emitting device also has a configuration in which a plurality of wiring layers are stacked, and insulating layers for preventing a short circuit between the plurality of wiring layers may be arranged between the plurality of wiring layers. The insulating layers may include inorganic or organic materials. On the other hand, outgassing may occur in the insulating layer including an organic material while the display apparatus is being used, because the gas generated from the organic material may not all be discharged during the manufacturing process of the display apparatus and may remain partially in the insulating layer including the organic material. In addition, when the display apparatus is used outdoors for a long time, sunlight may decompose the insulating layer including an organic material, and gas may be generated in the decomposition process. As described above, when an insulating layer including an organic material generates gas, the generated gas may deteriorate the organic emission layer, and defects such as pixel shrinkage may occur, thereby reducing the reliability of the display apparatus. Accordingly, research has been actively conducted to prevent defects such as pixel shrinkage due to gas generated from an insulating layer including an organic material.

The above information disclosed in this Background section is only for enhancement of understanding of the background of the invention and therefore it may contain information that does not form the prior art.

SUMMARY

Aspects of embodiments of the present disclosure are directed to a display apparatus capable of significantly reducing outgassing from an insulating layer or the like, including an organic material. However, these problems are exemplary, and the scope of the disclosure is not limited thereby.

Additional aspects will be set forth in part in the description which follows and, in part, will be apparent from the description, or may be learned by practice of the presented embodiments of the disclosure.

According to some embodiments of the disclosure, there is provided a display apparatus including: a substrate having a display area and a peripheral area surrounding the display area; a first initialization voltage line on the substrate; an organic film layer on the first initialization voltage line and having a first contact hole exposing at least a portion of the first initialization voltage line; and a bridge wiring on the organic film layer corresponding to the peripheral area, and in contact with the first initialization voltage line through the first contact hole, wherein the organic film layer corresponding to the peripheral area has a groove or dummy hole, each of the groove and the dummy hole being adjacent to the first contact hole.

In some embodiments, the display apparatus further includes: a second initialization voltage line on a same layer as the first initialization voltage line, wherein the organic film layer further has a second contact hole exposing the second initialization voltage line at least partially, and wherein the bridge wiring is in contact with the second initialization voltage line through the second contact hole.

In some embodiments, the bridge wiring includes a first portion extending in a first direction and in contact with the first initialization voltage line, and a second portion extending in the first direction and in contact with the second initialization voltage line.

In some embodiments, the groove or the dummy hole is between the first portion and the second portion.

In some embodiments, the bridge wiring at least partially overlaps the groove, and includes a step portion corresponding to the groove.

In some embodiments, a vertical distance from the substrate to a portion of an upper surface of the bridge wiring overlapping the groove is less than a vertical distance from the substrate to another portion of the upper surface of the bridge wiring other than the portion overlapping the groove.

In some embodiments, the display apparatus further includes a connection wiring on a same layer as the bridge wiring.

In some embodiments, the bridge wiring is integrated with the connection wiring.

In some embodiments, from a plan view, the connection wiring is bent at least twice.

According to some embodiments of the disclosure, there is provided a display apparatus including: a substrate has a display area and a peripheral area surrounding the display area; a first initialization voltage line on the substrate; a first organic film layer on the first initialization voltage line and having a first contact hole exposing at least a portion of the first initialization voltage line; a second organic film layer on the first organic film layer and including a third contact hole corresponding to the first contact hole; and a bridge wiring on the second organic film layer corresponding to the peripheral area, and in contact with the first initialization voltage line, wherein the second organic film layer corresponding to the peripheral area has a first dummy hole adjacent to the first contact hole and the third contact hole.

In some embodiments, the first organic film layer has a second dummy hole corresponding to the first dummy hole.

In some embodiments, the display apparatus further includes: a second initialization voltage line on a same layer as the first initialization voltage line, wherein the first organic film layer further has a second contact hole exposing the second initialization voltage line at least partially, wherein the second organic film layer further includes a fourth contact hole corresponding to the second contact hole, and wherein the bridge wiring contacts the second initialization voltage line through the second contact hole and the fourth contact hole.

In some embodiments, the bridge wiring includes a first portion extending in a first direction and in contact with the first initialization voltage line, and a second portion extending in the first direction and in contact with the second initialization voltage line, and the first dummy hole is between the first portion and the second portion.

In some embodiments, the second organic film layer further has a third dummy hole spaced from the first dummy hole and between the first portion and the second portion.

In some embodiments, the display apparatus further includes a connection wiring on a same layer as the bridge wiring.

In some embodiments, the display apparatus further includes a light-emitting device spaced, from a plan view, from the bridge wiring with the connection wiring therebetween, and arranged to correspond to the display area.

In some embodiments, the light-emitting device includes: a pixel electrode on a same layer as the bridge wiring; an intermediate layer on the pixel electrode; and an opposite electrode on the intermediate layer.

According to some embodiments of the disclosure, there is provided a display apparatus including: a substrate has a display area and a peripheral area surrounding the display area; a voltage wiring on the substrate; a first organic film layer on the voltage wiring and having a first contact hole exposing at least a portion of the voltage wiring; a second organic film layer on the first organic film layer and having a third contact hole corresponding to the first contact hole; and a bridge wiring on the second organic film layer corresponding to the peripheral area, and in contact with the voltage wiring, wherein the second organic film layer corresponding to the peripheral area has a dummy hole adjacent to the first contact hole and the third contact hole.

In some embodiments, the display apparatus further includes: a plurality of pixels on the display area and each receiving a first scan signal, a second scan signal, a third scan signal, a data voltage, and an initialization voltage, wherein each one of the plurality of pixels includes: a light-emitting device; a driving thin-film transistor configured to control a magnitude of current flowing through the light-emitting device based on a gate-source voltage; a storage capacitor between a power line and a gate of the driving thin-film transistor; a scan thin-film transistor configured to transmit the data voltage to a source of the driving thin-film transistor, in response to the second scan signal; a compensation thin-film transistor configured to connect a drain of the driving thin-film transistor to the gate of the driving thin-film transistor, in response to the second scan signal; a gate initialization thin-film transistor configured to apply the initialization voltage to the gate of the driving thin-film transistor, in response to the first scan signal; and an anode initialization thin-film transistor configured to apply the initialization voltage to an anode of the light-emitting device, in response to the third scan signal.

In some embodiments, the voltage wiring is an initialization voltage line configured to transmit the initialization voltage to each of the plurality of pixels.

Other aspects and features other than those described above will become apparent from the following detailed description, claims and drawings for carrying out the present embodiments.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1:
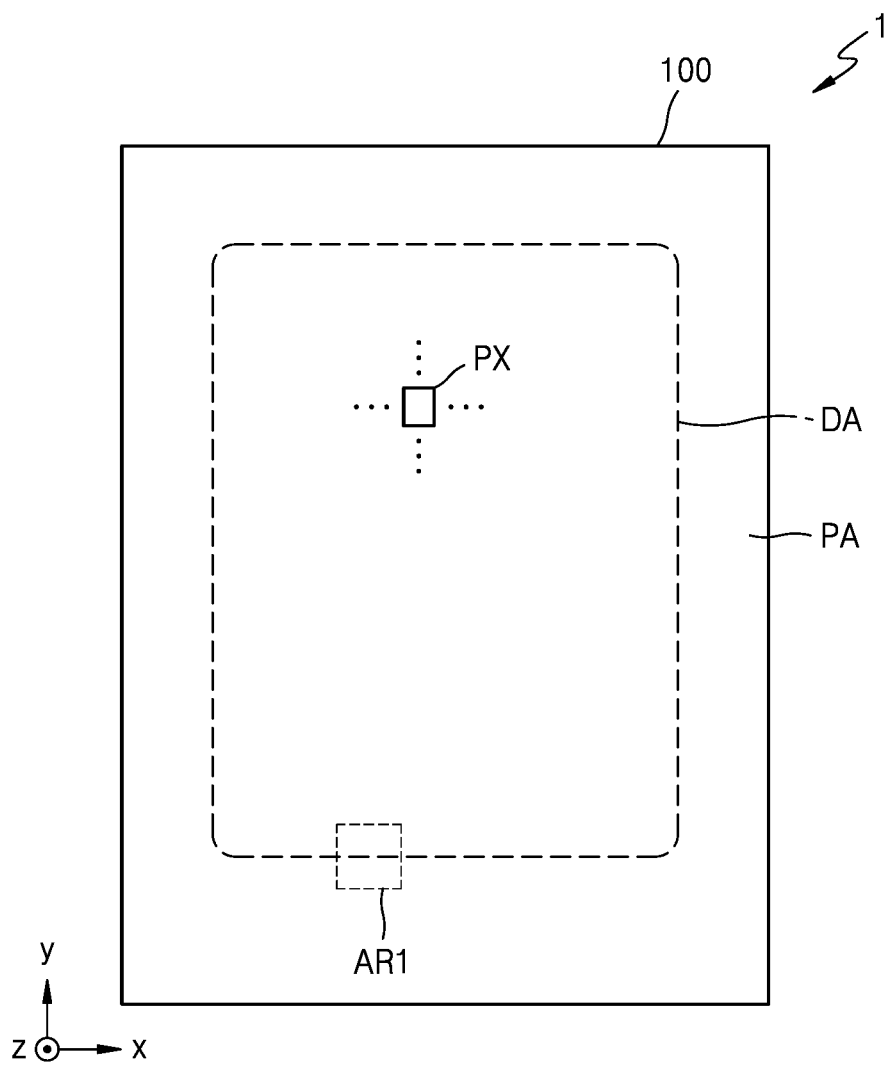
FIG. 1 is a plan view schematically illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Various modifications may be made to the disclosure and various embodiments are possible, and specific embodiments will be illustrated in the drawings and described in detail in the detailed description. Effects and features of the disclosure, and methods for achieving them will be clarified with reference to embodiments described below in detail with reference to the drawings. However, the disclosure is not limited to the embodiments disclosed below and may be implemented in various forms.

Hereinafter, exemplary embodiments of the disclosure will be described in detail with reference to the accompanying drawings. When describing with reference to the drawings, identical or corresponding components will be denoted by the same reference numerals and redundant description thereof will be omitted.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

As used herein, the terms "use," "using," and "used" may be considered synonymous with the terms "utilize," "utilizing," and "utilized," respectively.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art In the following embodiments, a singular expression includes a plural expression unless the context clearly indicates otherwise.

In the following embodiments, terms such as include or have means that a feature or component described in the specification exists, and does not preclude the possibility of adding one or more other features or components in advance.

In the following embodiments, when a part of a film, area, component, etc. is referred to as being on or above another part, it includes not only when it is directly above the other part, but also when another film, area, component, etc. is located therebetween.

In the drawings, the size of components may be exaggerated or reduced for convenience of description. For example, because the size and thickness of each component shown in the drawings are arbitrarily shown for convenience of description, the disclosure is not necessarily limited to what is illustrated.

When an embodiment may be implemented differently, a specific process order may be performed differently from the described order. For example, two processes described in succession may be performed substantially simultaneously, or may be performed in an order opposite to that described.

In the following embodiments, when a membrane, area, component, etc. is connected, it includes a case where membranes, areas, components are directly connected, and/or a case where other membranes, areas, components in the middle of membranes, areas, components are located therebetween and connected indirectly. For example, throughout the present specification, when a membrane, an area, a component, etc. are electrically connected, the membrane, the area, the component, etc. are directly electrically connected, or the membrane, the area, the component, etc. have another membrane, area, component, etc. located therebetween and electrically connected indirectly.

The x-axis, y-axis, and z-axis are not limited to three axes on the Cartesian coordinate system, and may be interpreted in a broad sense including them. For example, the x-axis, y-axis, and z-axis may be orthogonal to each other, but may refer to different directions that are not orthogonal to each other.

FIG. 1 is a plan view schematically illustrating a display apparatus, according to an embodiment.

Referring to FIG. 1, the display apparatus 1 includes a display area DA for displaying an image, and a peripheral area PA arranged around the display area DA. The display apparatus 1 may provide (e.g., display) an image to the outside using light emitted from the display area DA. Of course, because the display apparatus 1 includes a substrate 100, the substrate 100 may include such the display area DA and the peripheral area PA.

The substrate 100 may include various materials, such as glass, metal, plastic, and/or the like. According to an embodiment, the substrate 100 may include a flexible material. Here, the flexible material may refer to a substrate that is well-bent, foldable or rollable. The substrate 100 of a flexible material may include ultra-thin glass, metal, plastic, and/or the like.

A plurality of pixels PX including various display elements such as an organic light-emitting diode (OLED) may be arranged on the display area DA of the substrate 100. The plurality of pixels PX may be provided, and may be arranged in various forms, such as a stripe arrangement, a pentile arrangement, and a mosaic arrangement to realize an image.

When viewing the display area DA in a planar shape, the display area DA may be provided in a rectangular shape as shown in FIG. 1. In another embodiment, the display area DA may be provided in a polygonal shape, such as a triangular shape, a pentagonal shape, and a hexagonal shape, a circular shape, an elliptical shape, or an irregular shape.

A peripheral area PA of the substrate 100 is arranged around the display area DA (e.g., surrounds the display area DA), and may be an area in which an image is not displayed. In the peripheral area PA, various wirings configured to transmit electrical signals to be applied to the display area DA, and pads to which a printed circuit board or driver IC chip is attached may be located.

Figure 2:
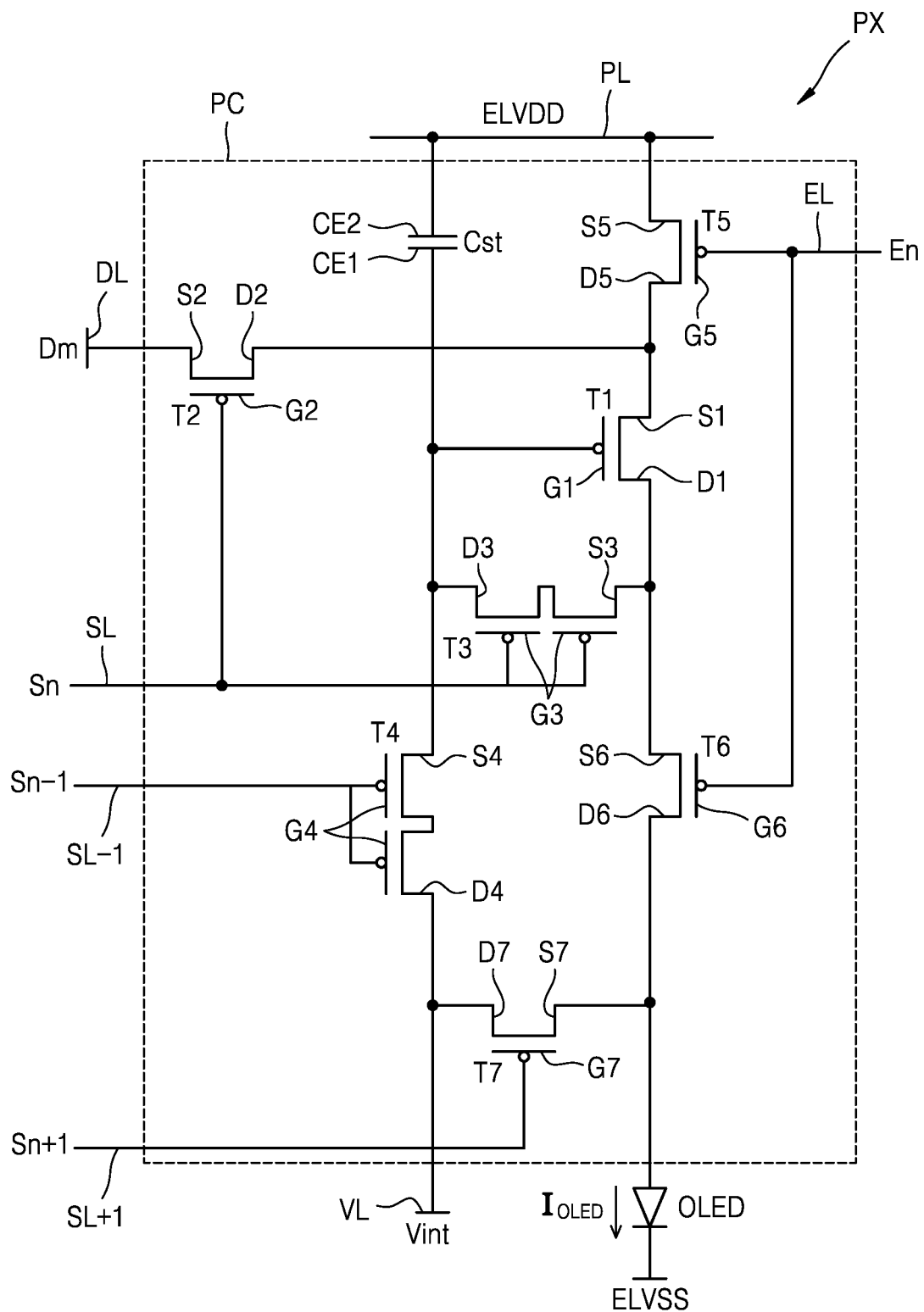
FIG. 2 is an equivalent circuit diagram schematically illustrating one pixel of a display panel, according to an embodiment.

FIG. 2 is an equivalent circuit diagram schematically illustrating one pixel of a display panel, according to an embodiment.

Referring to FIG. 2, one pixel PX may include a pixel circuit PC and an organic light-emitting diode OLED electrically connected to the pixel circuit PC.

As an example, the pixel circuit PC, as shown in FIG. 2, includes first to seventh thin-film transistors T1 to T7 and a storage capacitor Cst. The first to seventh thin-film transistors T1 to T7 and the storage capacitor Cst are respectively connected to first to third scan lines SL, SL−1, and SL+1, which are configured to respectively transmit first to third scan signals Sn, Sn−1, and Sn+1, a data line DL configured to transmit a data voltage Dm, an emission control line EL configured to transmit an emission control signal En, a driving voltage line PL configured to transmit a driving voltage ELVDD, an initialization voltage line VL configured to transmit an initialization voltage Vint, and a common electrode to which a common voltage ELVSS is applied.

The first thin-film transistor T1 may be a driving transistor in which the magnitude of drain current is determined according to a gate-source voltage, and the second to seventh thin-film transistors T2 to T7 may be switching transistors that are turned on/off according to a gate-source voltage, substantially, the gate voltage.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The storage capacitor Cst is connected between the driving voltage line PL and a driving gate G1 of the driving thin-film transistor T1. The storage capacitor Cst may have an upper electrode CE2 connected to the driving voltage line PL, and a lower electrode CE1 connected to the driving gate G1 of the driving thin-film transistor T1.

The driving thin-film transistor T1 may control the magnitude of driving current $I_{OLED}$ flowing from the driving voltage line PL to the organic light-emitting diode OLED, according to a gate-source voltage. The driving thin-film transistor T1 may include the driving gate G1 connected to the lower electrode CE1 of the storage capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may output a driving current $I_{OLED}$ to the organic light-emitting diode OLED, according to a gate-source voltage. A magnitude of the driving current $I_{OLED}$ is determined based on the difference between a gate-source voltage and threshold voltage of the driving thin-film transistor T1. The organic light-emitting diode OLED may receive a driving current $I_{OLED}$ from the driving thin-film transistor T1 and may emit light with a brightness corresponding to a magnitude of the driving current $I_{OLED}$.

The scan thin-film transistor T2 may transmit a data voltage Dm to the driving source S1 of the driving thin-film transistor T1, in response to the first scan signal Sn. The scan thin-film transistor T2 may include a scan gate G2 connected to the first scan line SL, a scan source S2 connected to the data line DL, and a scan drain D2 connected to driving source S1 of the driving thin-film transistor T1.

The compensation thin-film transistor T3 is connected in series between the driving drain D1 and driving gate G1 of the driving thin-film transistor T1, and connects the driving drain D1 to driving gate G1 of the driving thin-film transistor T1, in response to the first scan signal Sn. The compensation thin-film transistor T3 may include a compensation gate G3 connected to the first scan line SL, a compensation source S3 connected to the driving drain D1 of the driving thin-film transistor T1, and a compensation drain D3 connected to the driving gate G1 of the driving thin-film transistor T1. Although FIG. 2 shows that the compensation thin-film transistor T3 includes two thin-film transistors connected in series with each other, the compensation thin-film transistor T3 may be composed of one thin-film transistor.

The gate initialization thin-film transistor T4 applies an initialization voltage Vint to the driving gate G1 of the driving thin-film transistor T1, in response to the second scan signal Sn−1. The gate initialization thin-film transistor T4 may include a first initialization gate G4 connected to the second scan line SL−1, a first initialization source S4 connected to the driving gate G1 of the driving thin-film transistor T1, and a first initialization drain D4 connected to the initialization voltage line VL. In FIG. 2, the gate initialization thin-film transistor T4 is illustrated as including two thin-film transistors connected in series with each other; however, embodiments of the present disclosure are not limited thereto, and the gate initialization thin-film transistor T4 may be composed of one thin-film transistor.

The anode initialization thin-film transistor T7 applies an initialization voltage Vint to the anode of the organic light-emitting diode OLED, in response to the third scan signal Sn+1. The anode initialization thin-film transistor T7 may include a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may connect the driving voltage line PL to the driving source S1 of the driving thin-film transistor T1, in response to the emission control signal En. The first emission control thin-film transistor T5 may include a first emission-control gate G5 connected to the emission control line EL, a first emission-control source S5 connected to the driving voltage line PL, and a first emission-control drain D5 connected to the driving source S1.

The second emission control thin-film transistor T6 may connect the driving drain D1 of the driving thin-film transistor T1 to the anode of the organic light-emitting diode OLED, in response to the emission control signal En. The second emission control thin-film transistor T6 may include a second emission-control gate G6 connected to the emission control line EL, a second emission-control source S6 connected to the driving drain D1 of the driving thin-film transistor T1, and a second emission-control drain D6 connected to the anode of the organic light-emitting diode OLED.

The second scan signal Sn−1 may be substantially synchronized with the first scan signal Sn of the previous row of pixels. The third scan signal Sn+1 may be substantially synchronized with the first scan signal Sn. According to another example, the third scan signal Sn+1 may be substantially synchronized with the first scan signal Sn in the next row of pixels.

In this embodiment, the first to seventh thin-film transistors T1 to T7 may include a semiconductor layer containing silicon. For example, the first to seventh thin-film transistors T1 to T7 may include a semiconductor layer including low temperature poly-silicon (LTPS). The polysilicon material has high electron mobility (over 100 cm$^2$/Vs), low energy consumption, and excellent reliability. As another example, semiconductor layers of the first to seventh thin-film transistors T1 to T7 may include oxides of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, a semiconductor layer A may be an InSnZnO (ITZO) semiconductor layer, an InGaZnO (IGZO) semiconductor layer, or the like. As another example, some semiconductor layers of the first to seventh thin-film transistors T1 to T7 may include low-temperature polysilicon (LTPS), and some other semiconductor layers may include oxide semiconductor (e.g., IGZO).

Hereinafter, a detailed operation of one pixel PX of the display panel 10, according to an embodiment will be described in detail. As shown in FIG. 2, it is assumed that the first to seventh thin-film transistors T1 to T7 are p-type MOSFETs; however, embodiments of the present disclosure are not limited thereto, and any of the first to seventh thin-film transistors T1 to T7 may also be n-type MOSFETs if the corresponding drive signal is changed accordingly.

First, when a high-level emission control signal En is received, the first emission control thin-film transistor T5 and the second emission control thin-film transistor T6 are turned off, the driving thin-film transistor T1 stops output of driving current $I_{OLED}$, and the organic light-emitting diode OLED stops emitting light.

Thereafter, during a gate initialization period in which a low-level second scan signal Sn−1 is received, the gate initialization thin-film transistor T4 is turned on, and the initialization voltage Vint is applied to the driving gate G1 of the driving thin-film transistor T1, that is, the lower electrode CE1 of the storage capacitor Cst. A difference between the driving voltage ELVDD and the initialization voltage Vint (i.e., ELVDD−Vint) is stored in the storage capacitor Cst.

Thereafter, during a data writing period in which a low-level first scan signal Sn is received, the scan thin-film transistor T2 and the compensation thin-film transistor T3 are turned on, and the driving source S1 of driving thin-film transistor T1 receives the data voltage Dm. The driving thin-film transistor T1 is diode-connected by the compensation thin-film transistor T3, and compensated forward. A gate voltage of the driving thin-film transistor T1 rises at the initialization voltage Vint. When a gate voltage of the driving thin-film transistor T1 becomes equal to a data compensation voltage (Dm−|Vth|), which is obtained by subtracting a threshold voltage Vth of the driving thin-film transistor T1 from a data voltage Dm, the driving thin-film transistor is turns off, and the rise of the gate voltage of the driving thin-film transistor T1 stops. Accordingly, the storage capacitor Cst stores the difference (ELVDD−Dm+|Vth|) between the driving voltage ELVDD and the data compensation voltage (Dm−|Vth|).

In addition, during an anode initialization period when a low-level third scan signal Sn+1 is received, the anode initialization thin-film transistor T7 is turned on, and the initialization voltage Vint is applied to the anode of the organic light-emitting diode OLED. By applying the initialization voltage Vint to the anode of the organic light-emitting diode OLED such that the organic light-emitting diode OLED is completely non-emitted (e.g., completely off or dark), it is possible to eliminate a phenomenon that the organic light-emitting diode OLED emits light finely, even though in the next frame, the pixel PX receives a data voltage Dm corresponding to black gradation.

The first scan signal Sn and the third scan signal Sn+1 may be substantially synchronized, and in this case, the data writing period and the anode initialization period may be the same period.

Then, when a low-level emission control signal En is received, the first emission control thin-film transistor T5 and the second emission control thin-film transistor T6 are turned on, the driving thin-film transistor T1 may output a driving current $I_{OLED}$ corresponding to a voltage stored in the storage capacitor Cst, that is, a voltage (ELVDD−Dm) obtained by subtracting the threshold voltage (|Vth|) of the driving thin-film transistor T1 from the source-gate voltage (ELVDD−Dm+|Vth|) of driving thin-film transistor T1, and the organic light-emitting diode OLED may emit light with luminance corresponding to the magnitude of the driving current $I_{OLED}$.

An operation of one pixel PX of the display panel 10 is described assuming that the first to seventh thin-film transistors T1 to T7 are p-type MOSFETs, but as another example, some of the first to seventh thin-film transistors T1 to T7 may include a p-type MOSFET, and some may include an n-type MOSFET.

Figure 3:
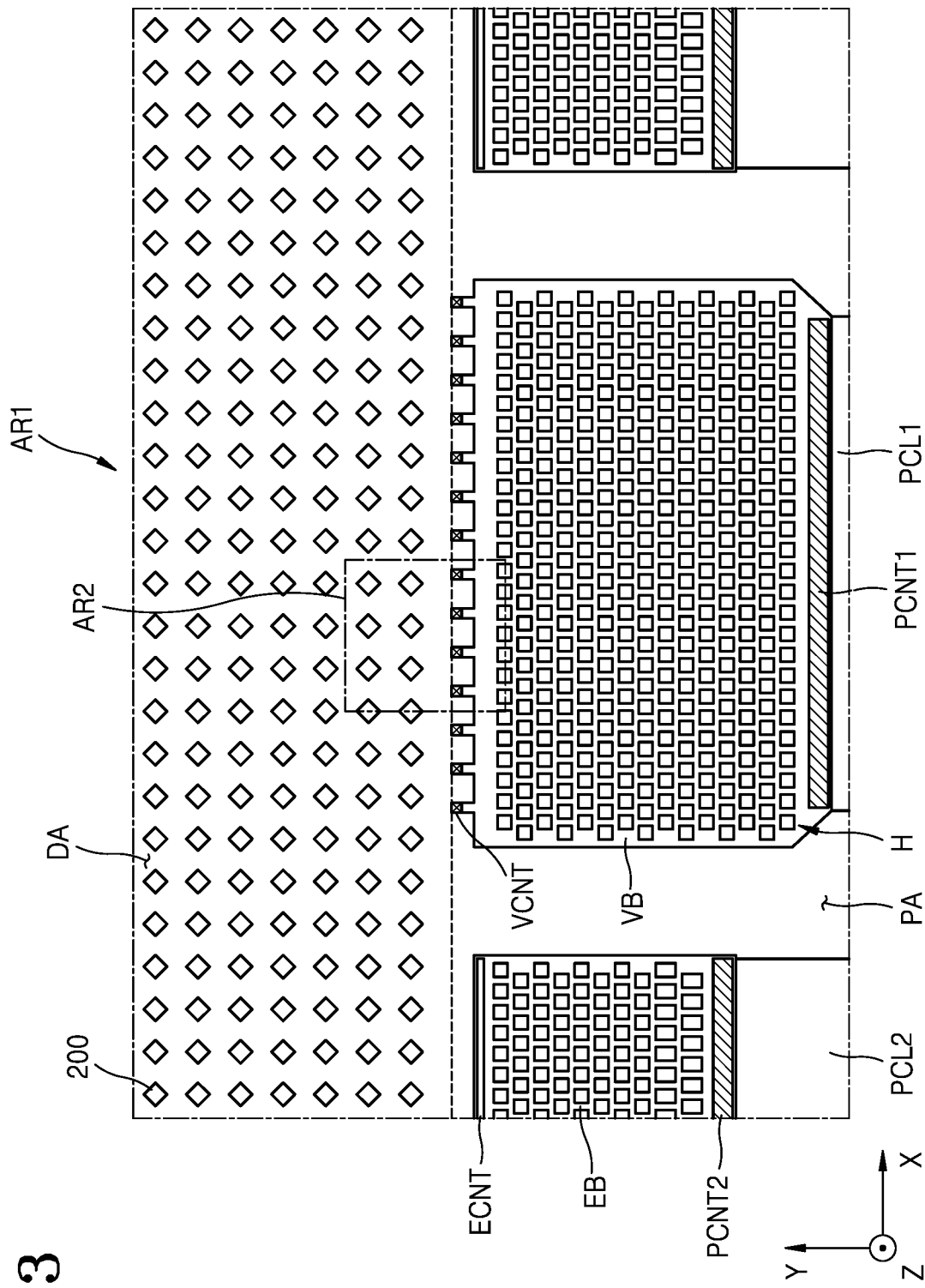
FIG. 3 is an enlarged plan view schematically illustrating part of the display apparatus of FIG. 1, according to an embodiment.

FIG. 3 is an enlarged plan view schematically illustrating part of the display apparatus of FIG. 1, according to an embodiment.

FIG. 3 is an enlarged first area AR1 of the display apparatus 1 of FIG. 1, and the first area AR1 corresponds to a boundary between the display area DA and the peripheral area PA.

Referring to FIG. 3, the display apparatus 1 may include a plurality of light-emitting devices 200 arranged in the display area DA, and may include an initialization bridge wiring VB and a driving bridge wiring EB as bridge wirings, a first pad connection wiring PCL1, a second pad connection wiring PCL2, and the like, arranged in the peripheral area PA.

Each of the plurality of light-emitting devices 200 may be an organic light-emitting diode OLED including an anode and a cathode. The plurality of light-emitting devices 200 may be arranged in the row direction (X) and/or the column direction (Y), as shown in FIG. 3. For example, the plurality of light-emitting devices 200 may be arranged in a matrix form. As another example, the plurality of light-emitting devices 200 may be arranged to have various suitable structures, such as a stripe structure, a mosaic array structure, a delta array structure, and a pentile matrix structure. Because each of the plurality of pixels PX (see FIG. 1) includes a plurality of light-emitting devices 200, the plurality of pixels PX may also be arranged in various suitable structures, such as a stripe structure, a mosaic array structure, a delta array structure, and a pentile matrix structure.

The initialization bridge wiring VB may include a plurality of parts each extending in the +Y direction, and each of the plurality of parts may transmit an initialization voltage Vint (see FIG. 2) to the plurality of pixels PX through each of a plurality of contact holes VCNT (hereinafter referred to as the initialization contact holes).

The initialization bridge wiring VB may be a light-transmitting electrode (e.g., a semi light-transmitting electrode) or a reflective electrode. In some embodiments, the initialization bridge wiring VB may include a reflective layer including Ag, Mg, Al, Pt, Pd, Au, Ni, Nd, Ir, Cr, and/or their compounds, and a transparent or translucent electrode layer formed on the reflective layer. The initialization bridge wiring VB may have a plurality of holes H, and for example, the plurality of holes H may be outgassing holes.

The initialization bridge wiring VB may be connected to the first pad connection wiring PCL1 through a first pad contact hole PCNT1. The first pad connection wiring PCL1 may extend in a first direction (e.g., Y direction) and may be connected to a pad unit arranged at one side of the display apparatus 1. The pad unit may be exposed without being covered by an insulating layer, and electrically connected to a printed circuit board. The printed circuit board may transmit a signal or power of a controller to the display apparatus 1.

For example, an initialization voltage Vint may be supplied by a signal of the controller transmitted from the printed circuit board. The initialization voltage Vint may be transmitted to the initialization bridge wiring VB through the first pad connection wiring PCL1 connected to the pad unit. The initialization bridge wiring VB may transmit an initialization voltage Vint to each of the plurality of pixels PX through each of a plurality of initialization contact holes VCNT. That is, the initialization bridge wiring VB may transmit, to each of the plurality of pixels PX, the initialization voltage Vint received from the printed circuit board and the pad unit through the first pad connection wiring PCL1. A portion where the initialization bridge wiring VB is arranged may be understood as a portion where the initialization voltage Vint is input.

The driving bridge wiring EB may be arranged on the left side and/or the right side of the initialization bridge wiring VB. FIG. 3 shows that the driving bridge wiring EB is arranged at opposite sides of the initialization bridge wiring VB; however, embodiments of the present disclosure are not limited thereto, and the driving bridge wiring EB may be arranged only on one side (e.g., the left side) of the initialization bridge wiring VB.

The driving bridge wiring EB may transmit the driving voltage ELVDD (see FIG. 2) to a driving voltage supply wiring arranged under the driving bridge wiring EB, through a driving contact hole ECNT extending in the X direction. The driving bridge wiring EB may include the same or substantially the same material as the initialization bridge wiring VB. For example, the driving bridge wiring EB may be a light-transmitting electrode (e.g., a semi light-transmitting electrode) or a reflective electrode. In addition, the driving bridge wiring EB may be provided with a plurality of holes H, which may be, for example, outgassing holes.

The driving bridge wiring EB may be connected to the second pad connection wiring PCL2 through a second pad contact hole PCNT2. The second pad connection wiring PCL2 may extend in the first direction and may be connected to the pad unit arranged at one side of the display apparatus 1. The pad unit may be exposed without being covered by an insulating layer, and electrically connected to the printed circuit board. The driving voltage ELVDD may be supplied by the controller's signal received from the printed circuit board. The driving voltage ELVDD may be transmitted to the driving bridge wiring EB through the second pad connection wiring PCL2 connected to the pad unit. The driving bridge wiring EB may transmit the driving voltage ELVDD to the driving voltage supply wiring arranged under the driving bridge wiring EB, through the driving contact hole ECNT. That is, the driving bridge wiring EB may transmit, to the driving voltage supply wiring, the driving voltage ELVDD received from the printed circuit board and the pad unit through the second pad connection wiring PCL2, and the driving voltage ELVDD may be transmitted from the driving voltage supply wiring to each of the plurality of pixels PX. A portion where the driving bridge wiring EB is arranged may be understood as a portion where the driving voltage ELVDD is input.

A gate driving circuit, a multiplexer (mux), a demultiplexer (demux), and various wirings may be arranged under the initialization bridge wiring VB and the driving bridge wiring EB.

The gate driving circuit may provide the scan signal Sn (see FIG. 2) to each of the pixels PX through the scan line SL (see FIG. 2). In addition, the gate driving circuit may provide the emission control signal En (see FIG. 2) to each of the pixels PX through the emission control line EL (see FIG. 2). The multiplexer corresponds to a device that selects one of several analog or digital input signals and delivers the selected input to one line, and the demultiplexer corresponds to a device that receives one input signal and selects one of numerous data output lines. Various wirings may correspond to a common voltage supply wiring, a data connection wiring, a driving voltage connection wiring, and the like.

It may be understood that the initialization bridge wiring VB and the driving bridge wiring EB serve as a bridge to avoid the gate driving circuit, the multiplexer, and the demultiplexer arranged under the initialization bridge wiring VB and the driving bridge wiring EB, and transmit the initialization voltage Vint and the driving voltage ELVDD to the display area DA, respectively.

Although FIG. 3 shows that the initialization bridge wiring VB and the driving bridge wiring EB are arranged at the lower end of the display apparatus 1, as another example, the initialization bridge wiring VB and the driving bridge wiring EB may be arranged at another side of the display apparatus 1. In addition, a plurality of initialization bridge wirings VB and a plurality of driving bridge wirings EB may be formed. That is, a plurality of portions may receive inputs of initialization voltage Vint and driving voltage ELVDD. For example, four initialization bridge wirings VB and four driving bridge wirings EB may be arranged at the lower end of the display apparatus 1.

Figure 4:
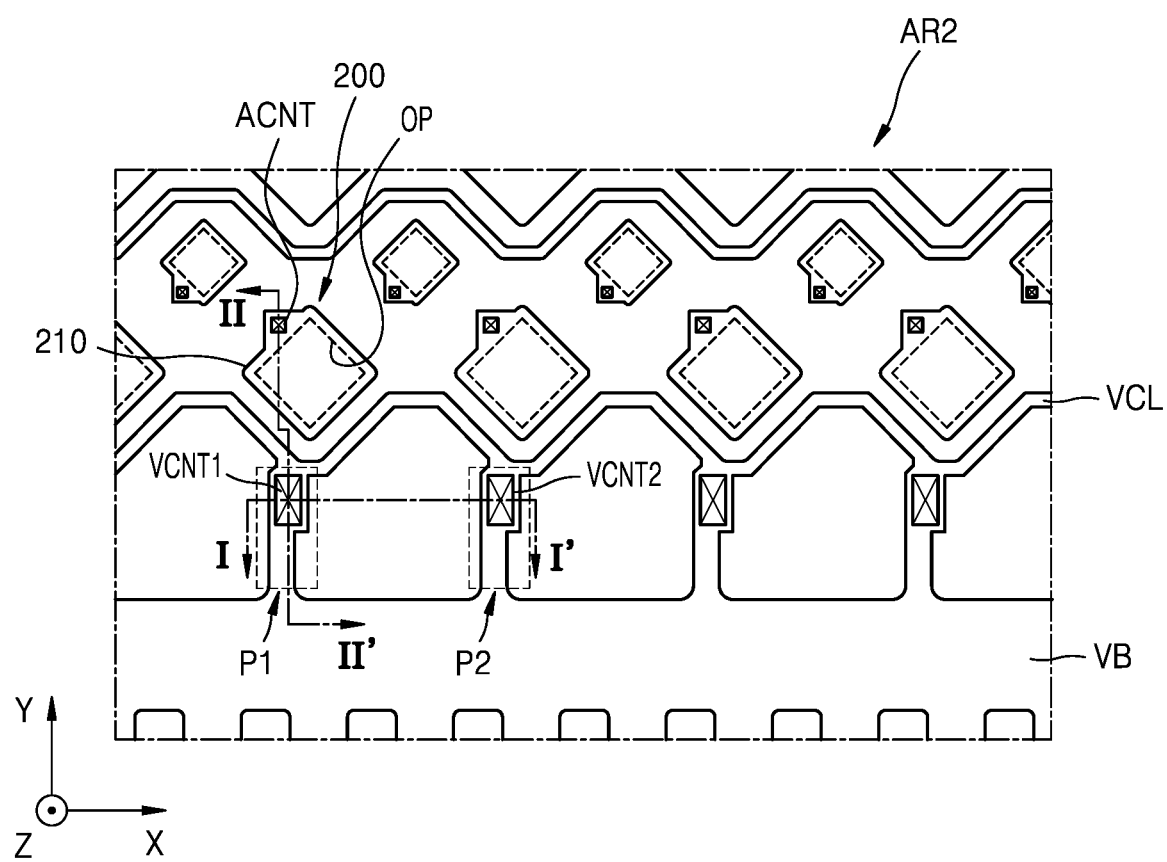
FIG. 4 is an enlarged plan view schematically illustrating part of the display apparatus of FIG. 3, according to an embodiment.
Figure 5A:
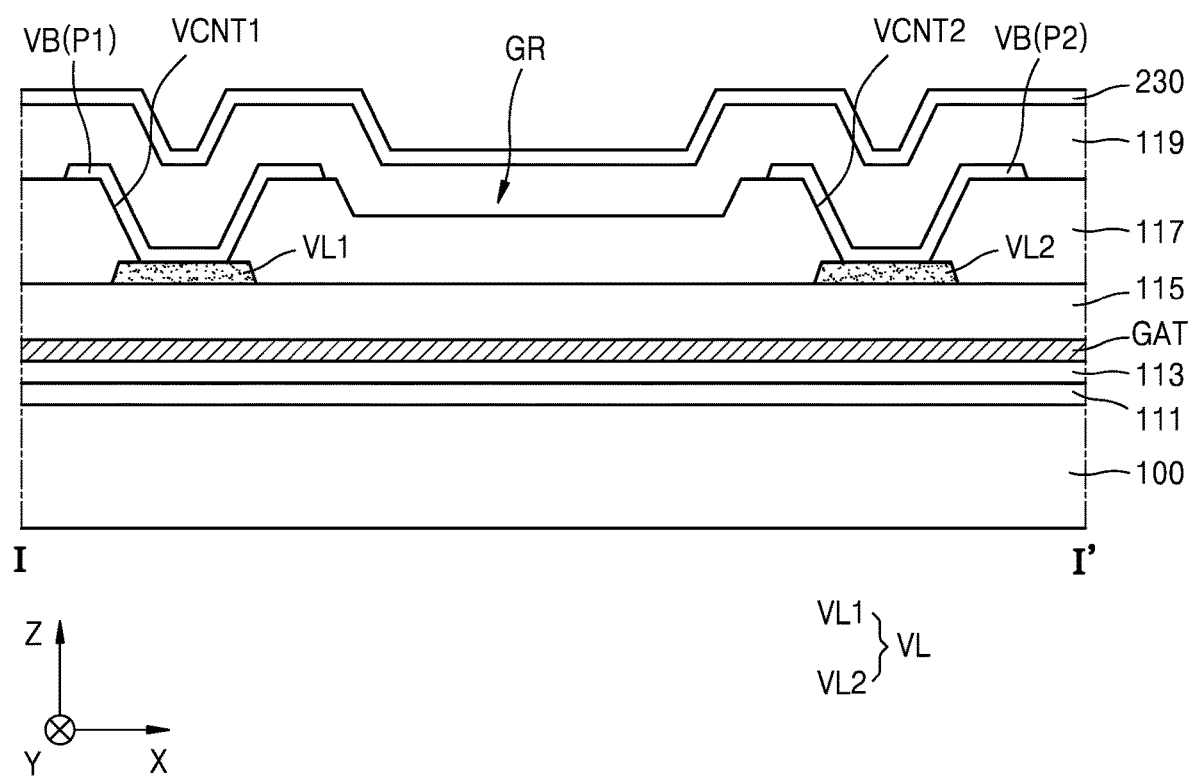
FIGS. 5A and 5B are exemplary cross-sectional views of a bridge wiring of FIG. 4 taken along line I-I'.
Figure 5B:
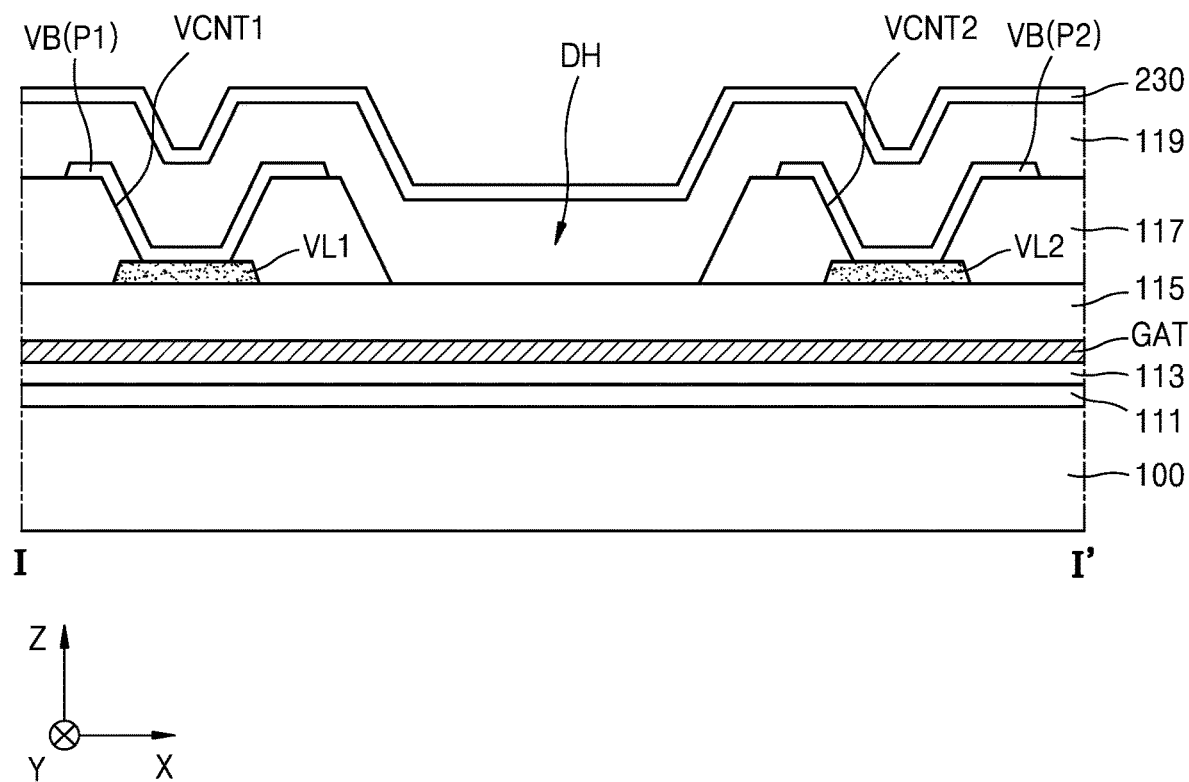
Figure 6:
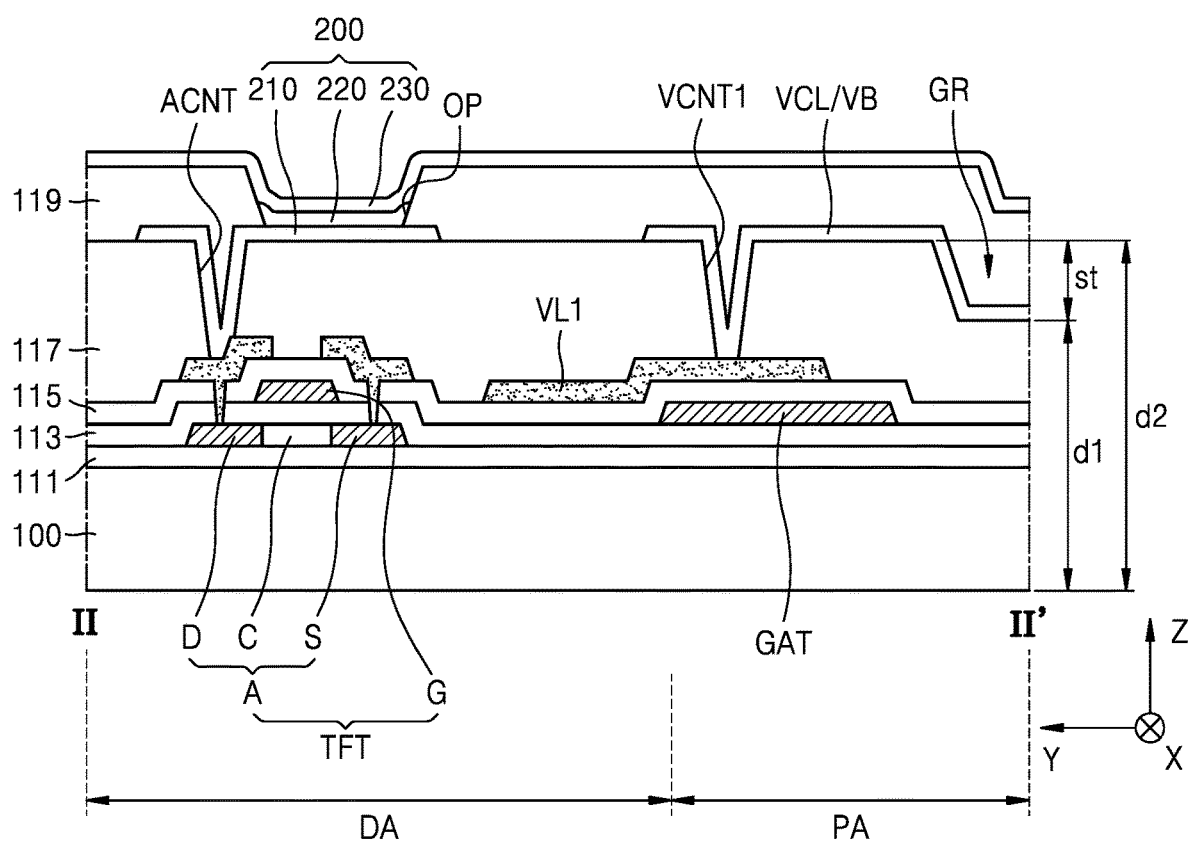
FIG. 6 is an exemplary cross-sectional view of a bridge wiring and light-emitting device of FIG. 4 taken along line II-II'.

FIG. 4 is an enlarged plan view schematically illustrating part of the display apparatus of FIG. 3, and FIGS. 5A and 5B are exemplary cross-sectional views of a bridge wiring of FIG. 4 taken along line I-I'. FIG. 6 is an exemplary cross-sectional view of the bridge wiring and the light-emitting device of FIG. 4 taken along line II-II'.

Referring to FIG. 4, the display apparatus 1 (see FIG. 1) may include a plurality of light-emitting devices 200 arranged in the display area DA, an initialization connection wiring VCL as connection wirings, and the initialization bridge wiring VB arranged in the peripheral area PA.

As shown in FIG. 4, the plurality of light-emitting devices 200 may be arranged to be spaced from the initialization bridge wiring VB with the initialization connection wiring VCL therebetween. The plurality of light-emitting devices 200 may be arranged in various suitable structures, such as a stripe structure, a mosaic array structure, a delta array structure, and a pentile matrix structure.

The initialization connection wiring VCL may be arranged adjacent to the plurality of light-emitting devices 200, and may include the same or substantially the same material as the initialization bridge wiring VB. For example, the initialization connection wiring VCL may be a light-transmitting electrode (e.g., a semi light-transmitting electrode) or a reflective electrode.

The initialization connection wiring VCL may be connected to each of portions of the initialization bridge wiring VB extending in a +Y direction. For example, each of a first portion P1 and a second portion P2 of the initialization bridge wiring VB may extend in the +Y direction, and may be connected to the initialization connection wiring VCL. The initialization connection wiring VCL may be integrated with the initialization bridge wiring VB. Therefore, the initialization connection wiring VCL may transmit the initialization voltage Vint (see FIG. 2) to each of the plurality of pixels PX (see FIG. 1), as in the initialization bridge wiring VB.

The initialization connection wiring VCL may have a shape that is bent at least two times, from a plan view, as shown in FIG. 3, and may be arranged to avoid the plurality of light-emitting devices 200. For example, the initialization connection wiring VCL may not overlap the plurality of light-emitting devices 200 and be routed around the plurality of light-emitting devices 200, in a plan view. In addition, the initialization connection wiring VCL may have a mesh structure. The initialization connection wiring VCL and the initialization bridge wiring VB may each be connected to the initialization voltage line VL as a voltage wiring arranged under the initialization connection wiring VCL and the initialization bridge wiring VB, through each of the plurality of initialization contact holes VCNT. In addition, because the initialization bridge wiring VB has a plurality of parts, the initialization connection wiring VCL and the initialization bridge wiring VB may be connected to different initialization voltage lines VL. For example, the first portion P1 of the initialization bridge wiring VB may be connected to a first initialization voltage line VL1 through a first initialization contact hole VCNT1, and the second portion P2 of the initialization bridge wiring VB may be connected to a second initialization voltage line VL2 through a second initialization contact hole VCNT2. In addition, the initialization voltage line VL may be extended in the X direction or the Y direction, and the initialization voltage Vint may be transmitted to each of the plurality of pixels PX through the initialization voltage line VL.

In an embodiment, the display apparatus 1 may include an organic film layer 117 arranged on the substrate 100. The initialization connection wiring VCL and the initialization bridge wiring VB may each be arranged on the organic film layer 117, and the organic film layer 117 may have the plurality of initialization contact holes VCNT. The organic film layer 117 corresponding to the peripheral area PA may have grooves GR or dummy holes DH, which are adjacent to the plurality of initialization contact holes VCNT. In other words, the organic film layer 117 may have grooves GR or dummy holes DH corresponding to portions of the peripheral area PA surrounding the plurality of initialization contact holes VCNT.

The groove GR or the dummy hole DH formed in the organic film layer 117 may be arranged between portions of the initialization bridge wiring VB, each of the portions of the initialization bridge wiring VB extending in the +Y direction. For example, the groove GR or the dummy hole DH may be arranged between the first portion P1 of the initialization bridge wiring VB and the second portion P2 of the initialization bridge wiring VB.

Hereinafter, a configuration included in the display apparatus 1 will be described in more detail with reference to FIGS. 5A, 5B, and 6 according to a stacked structure, and an arrangement relationship among the initialization bridge wiring VB, the initialization voltage line VL, the groove GR, and the dummy hole DH will be described.

The substrate 100 may include glass or polymer resin. Polymer resins include polyethersulfone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 containing a polymer resin may have flexible, rollable, or bendable properties. The substrate 100 may be a multi-layer structure including a layer including the above-described polymer resin and an inorganic layer.

The buffer layer 111 may reduce or block the penetration of foreign matter, moisture, or outside air from the bottom of the substrate 100, and may provide a flat surface on the substrate 100. The buffer layer 111 may include an inorganic material such as an oxide or nitride, or an organic material or an organic-inorganic composite, and may be a single layer or multi-layer structure of the inorganic material and the organic material.

A barrier layer may be further included between the substrate 100 and the buffer layer 111. The barrier layer may serve to prevent or reduce impurities from the substrate 100 or the like penetrating into the semiconductor layer A. The barrier layer may include an inorganic material such as an oxide or nitride, or an organic material or an organic-inorganic composite, and may be a single layer or multi-layer structure of the inorganic material and the organic material.

The semiconductor layer A may be arranged on the buffer layer 111 corresponding to the display area DA. The semiconductor layer A may include amorphous silicon, polysilicon. And/or the like. In another embodiment, the semiconductor layer A may include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel area C, and a source area S and a drain area D arranged at opposite sides of the channel area C. The semiconductor layer A may include a single layer or multiple layers.

A gate insulating layer 113 may be stacked and arranged on the substrate 100 to cover the semiconductor layer A. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

A gate electrode G may be arranged on the gate insulating layer 113 corresponding to the display area DA to at least partially overlap the semiconductor layer A, and a gate layer GAT corresponding to the peripheral area PA may be arranged on the gate insulating layer 113. The gate electrode G and the gate layer GAT may each be formed of a single layer or multi layers of one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, the gate layer GAT may correspond to various wirings such as common voltage supply wiring, data connection wiring, driving voltage connection wiring, and the like. In FIG. 5A, the gate layer GAT covers the entire surface of the gate insulating layer 113; however, embodiments of the present disclosure are not limited thereto. For example, as shown in FIG. 6, the gate layer GAT may be patterned together with the gate electrode G.

An interlayer insulating layer 115 may be arranged on the gate insulating layer 113 to cover the gate electrode G and the gate layer GAT. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

A source electrode, a drain electrode, a data line, the initialization voltage line VL, or the like may be arranged on the interlayer insulating layer 115. The source electrode, the drain electrode, the data line, and the initialization voltage line VL may include a conductive material including molybdenum (Mo), aluminum (Al), copper (Cu), titanium (Ti), and/or the like, and may be structured as a multi-layer or a single layer including the aforementioned material. For example, the source electrode, the drain electrode, the data line, and the initialization voltage line VL may have a multilayer structure of Ti/Al/Ti. The source electrode and the drain electrode may be connected to the source area S or the drain area D of the semiconductor layer A through contact holes. The cross-sectional view shown in FIG. 2A is taken along line II-II' of FIG. 2, and thus, the initialization voltage line VL is shown in a disconnected manner. However, the initialization voltage line VL may continuously extend in the Y direction, and the initialization voltage Vint may be transmitted to each of the plurality of pixels PX arranged in the same column, through the initialization voltage line VL.

The source electrode, the drain electrode, the data line, and the initialization voltage line VL may be covered with an inorganic protective layer. The inorganic protective layer may be a single film or a multilayer film of silicon nitride ($SiN_x$) and silicon oxide ($SiO_x$). The inorganic protective layer may be introduced to cover and protect some wirings arranged on the interlayer insulating layer 115.

The organic film layer 117 is arranged to cover the source electrode, the drain electrode, the data line, and the initialization voltage line VL, and may have an anode contact hole ACNT for connecting a thin-film transistor TFT to a pixel electrode 210. The thin-film transistor TFT and the pixel electrode 210 may be arranged in the display area DA. In addition, the organic film layer 117 has a plurality of initialization contact holes VCNT for connecting portions of the initialization bridge wiring VB and the initialization voltage line VL, wherein each of the portions of the initialization bridge wiring VB and the initialization voltage line VL is arranged in the peripheral area PA. The organic film layer 117 has the plurality of initialization contact holes VCNT for connecting portions of the initialization bridge wirings VB, each extending in the +Y direction and a plurality of initialization voltage lines VL. For example, the organic film layer 117 has the first initialization contact hole VCNT1 connecting the first portion P1 of the initialization bridge wiring VB to the first initialization voltage line VL1, and the second initialization contact hole VCNT2 connecting the second portion P2 of the initialization bridge wiring VB to the second initialization voltage line VL2.

In an embodiment, as shown in FIG. 5A, the organic film layer 117 corresponding to the peripheral area PA may have the groove GR adjacent to each of the plurality of initialization contact holes VCNT, or as shown in FIG. 5B, the organic film layer 117 corresponding to the peripheral area PA may have the dummy hole DH adjacent to each of the plurality of initialization contact holes VCNT. In other words, the organic film layer 117 may have grooves GR or dummy holes DH corresponding to portions of the peripheral area PA surrounding the plurality of initialization contact holes VCNT.

The groove GR or the dummy hole DH formed in the organic film layer 117 may be arranged between portions of the initialization bridge wiring VB, each of the portions of the initialization bridge wiring VB extending in the +Y direction. For example, the groove GR or the dummy hole DH may be arranged between the first portion P1 of the initialization bridge wiring VB and the second portion P2 of the initialization bridge wiring VB.

When the organic film layer 117 corresponding to the peripheral area PA includes the groove GR, the organic film layer 117 may use a half-tone mask or a slit mask, and may be formed through a hard drying process.

The organic film layer 117 may be formed of a single layer or multiple layers of an organic material, and provides a flat top surface. The organic film layer 117 is a general-purpose polymer such as benzocyclobutene (BCB), polyimide, hexamethyldisiloxane (HMDSO), poly(methyl methacrylate) (PMMA), or polystyrene (PS), a polymer derivative having a phenolic group, an acrylic polymer, imide polymers, aryl ether polymers, amide polymers, fluorine polymers, p-xylene polymers, vinyl alcohol polymers, and blends thereof.

On the organic film layer 117, the light-emitting device 200, the initialization bridge wiring VB, and the initialization connection wiring VCL are arranged. The light-emitting device 200 includes the pixel electrode 210, an intermediate layer 220 including an organic emission layer, and an opposite electrode 230.

In an embodiment, as shown in FIG. 6, the initialization bridge wiring VB may overlap at least partly with the groove GR formed in the organic film layer 117, and may have a step portion st (e.g., a step with a height of st) by the groove GR. That is, a vertical distance d1 from the substrate 100 to an upper surface of the initialization bridge wiring VB overlapped with the groove GR may be less than a vertical distance d2 from the substrate 100 to an upper surface of the initialization bridge wiring VB except for (e.g., other than) the overlapped portion with the groove GR. Although the groove GR is described as an example, the dummy hole DH may be equally applied in a range where the lower metal, or the like arranged on the interlayer insulating layer 115 do not come in contact with the initialization bridge wiring VB.

In FIG. 6, the organic film layer 117 is illustrated to include the groove GR located in the −Y direction from the first portion P1 of the initialization bridge wiring VB; however, embodiments of the present disclosure are not limited thereto. For example, as illustrated in FIGS. 5A and 5B, the organic film layer 117 may also have the groove GR or the dummy hole DH only between the first portion P1 and second portion P2 of the initialization bridge wiring VB. The groove GR or the dummy hole DH formed in a portion extending in the −Y direction from the first portion P1 of the initialization bridge wiring VB may be omitted.

The pixel electrode 210, the initialization bridge wiring VB, and the initialization connection wiring VCL may be light-transmitting electrodes (e.g., semi light-transmitting electrodes) or reflective electrodes. In some embodiments, the pixel electrode 210, the initialization bridge wiring VB, and the initialization connection wiring VCL may include a reflective layer including Ag, Mg, Al, Pt, Pd, Au, Ni, Nd, Ir, Cr, their compounds, and/or the like, and a transparent or translucent electrode layer formed on the reflective layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210, the initialization bridge wiring VB, and the initialization connection wiring VCL may be provided with ITO/Ag/ITO.

A pixel-defining layer 119 may be arranged on the organic film layer 117. In addition, the pixel-defining layer 119 may serve to prevent arcs from occurring or substantially reduce occurrences thereof at the edge of the pixel electrode 210 by increasing the distance between the edge of the pixel electrode 210 and the opposite electrode 230 on the top of the pixel electrode 210.

The pixel-defining layer 119 is at least one organic insulating material selected from the group consisting of polyimide, polyamide, acrylic resin, benzocyclobutene and phenol resin, and may be formed by a method such as spin coating.

The intermediate layer 220 may be arranged in an opening OP formed by the pixel-defining layer 119, and may include an organic emission layer. The organic emission layer may include an organic material including a fluorescent or phosphorescent material that emits red, green, blue, or white light. The organic emission layer may be a low-molecular organic material or a high-molecular organic material, and below and above the organic emission layer, a functional layer such as a hole transport layer (HTL), a hole injection layer (HIL), an electron transport layer (ETL), and an electron injection layer (EIL) may be selectively further arranged.

The opposite electrode 230 may be a light-emitting electrode or a reflective electrode. In some embodiments, the opposite electrode 230 may be a transparent or translucent electrode, and may include a metal thin film having a small work function, including Li, Ca, LiF/Ca, LiF/Al, Al, Ag, Mg, and compounds thereof. In addition, a transparent conductive oxide (TCO) film such as ITO, IZO, ZnO, or $In_2O_3$ may be further arranged on the metal thin film. The opposite electrode 230 may be arranged over the display area DA, and may be arranged above the intermediate layer 220 and the pixel-defining layer 119. The opposite electrode 230 may be formed integrally with respect to a plurality of organic light-emitting diodes (OLED) and may correspond to a plurality of pixel electrodes 210.

Because the organic light-emitting devices may be easily damaged by moisture or oxygen from the outside, an encapsulation layer may cover the organic light-emitting devices to protect the organic light-emitting devices. The encapsulation layer may, while covering the display area DA, extend to at least a portion of the peripheral area PA. The encapsulation layer may include a first inorganic encapsulation layer, an organic encapsulation layer, and a second inorganic encapsulation layer.

As described above, in an embodiment, the organic film layer 117 corresponding to the peripheral area PA may have the groove GR or the dummy hole DH, which is adjacent to each of the plurality of initialization contact holes VCNT. In other words, the organic film layer 117 may have grooves GR or dummy holes DH corresponding to portions of the peripheral area PA surrounding the plurality of initialization contact holes VCNT.

As a comparative example, an organic film layer corresponding to the peripheral area may not have grooves or dummy holes. In this case, outgassing may occur from an organic film layer made of an organic material, and a defect such as pixel shrinkage may occur due to deterioration of the organic emission layer by the generated gas, thereby reducing reliability of the display apparatus. In particular, the pixel shrinkage due to outgassing of the organic film layer may frequently occur in pixels that are arranged adjacent to a portion to which an initialization voltage is input. The reason for this is as follows. As illustrated in FIG. 3, each of an initialization voltage and a driving voltage may be transmitted to pixels through bridge wirings. The bridge wirings may transmit the initialization voltage and the driving voltage to the pixels through the contact holes. The contact holes formed to transmit the initialization voltage may have less area and volume than the contact holes formed to transmit the driving voltage. In addition, contact holes formed to transmit the initializing voltage may be arranged closer to the display area than contact holes formed to transmit the driving voltage. Because the contact holes formed to transmit the initialization voltage have less area and volume than the contact holes formed to transmit the driving voltage, many organic film layers are distributed around the contact holes formed to transmit the initialization voltage, and thereby, defects such as pixel shrinkage due to outgassing of the organic film layer may occur more frequently.

However, as shown in an embodiment, the organic film layer 117 corresponding to the peripheral area PA may have the groove GR or the dummy hole DH, which is arranged adjacent to the initialization contact hole VCNT that connects the initialization bridge wiring VB for transferring the initialization voltage Vint, to the initialization voltage line VL. In other words, the organic film layer 117 may have the groove GR or the dummy hole DH corresponding to a portion of the peripheral area PA surrounding the initialization contact hole VCNT. In this case, because the organic film layer 117 adjacent to the light-emitting device 200 arranged in the display area DA is partially removed by the groove GR or the dummy hole DH, the volume of organic matter in the display apparatus 1 is reduced, and thus, the outgassing of organic matter may be significantly reduced. Therefore, even if the display apparatus 1 is exposed to sunlight for a long time, it is possible to prevent or significantly reduce decomposition of organic matter by sunlight, so that defects such as pixel shrinkage due to outgassing may be prevented or substantially reduced. The reliability of the display apparatus 1 may be improved.

Figure 7A:
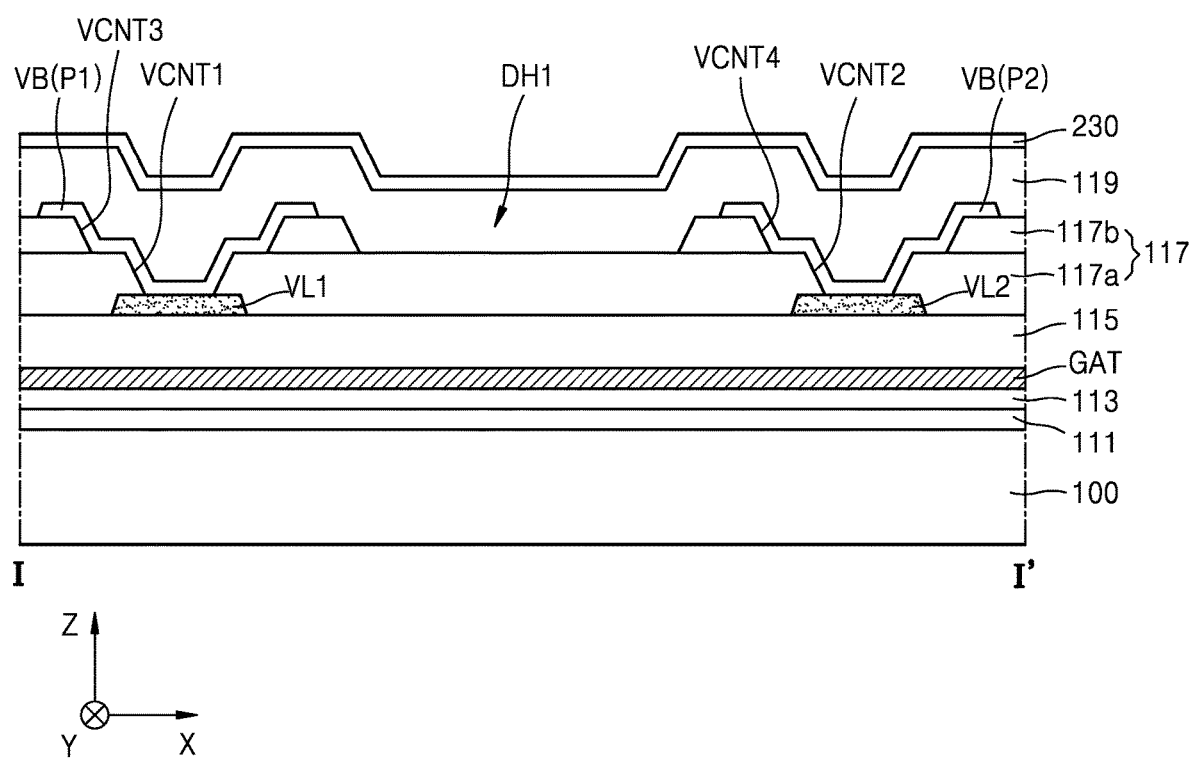
FIGS. 7A, 7B, and 7C are exemplary cross-sectional views of the bridge wiring of FIG. 4 taken along line I-I'.
Figure 7B:
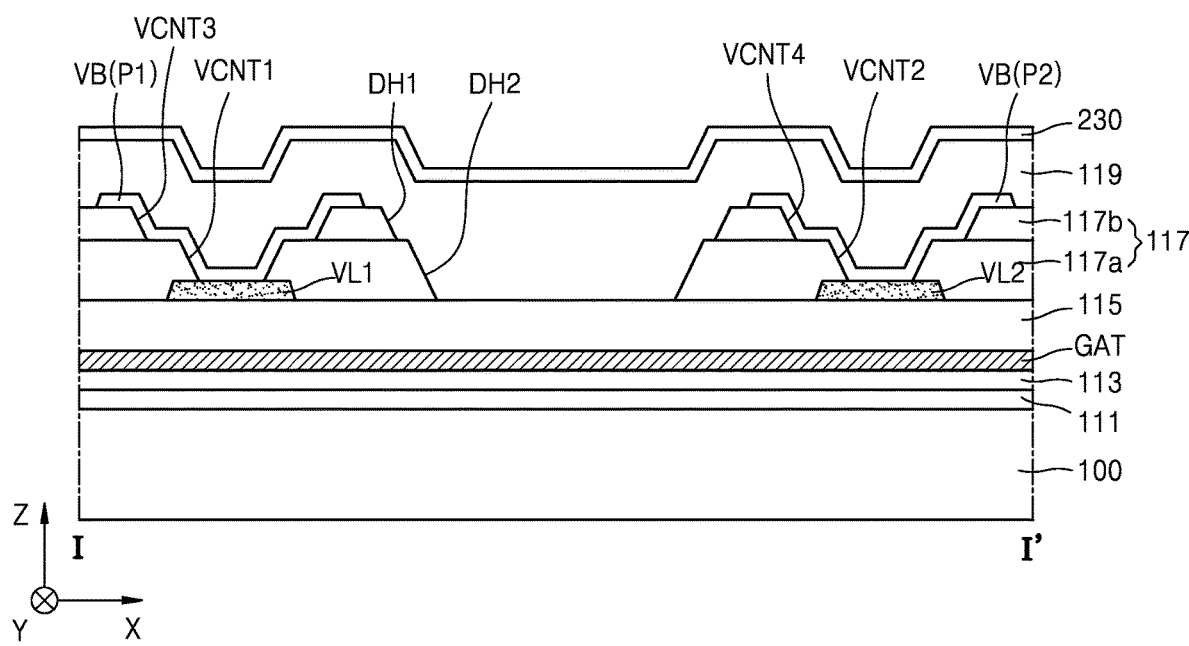
Figure 7C:
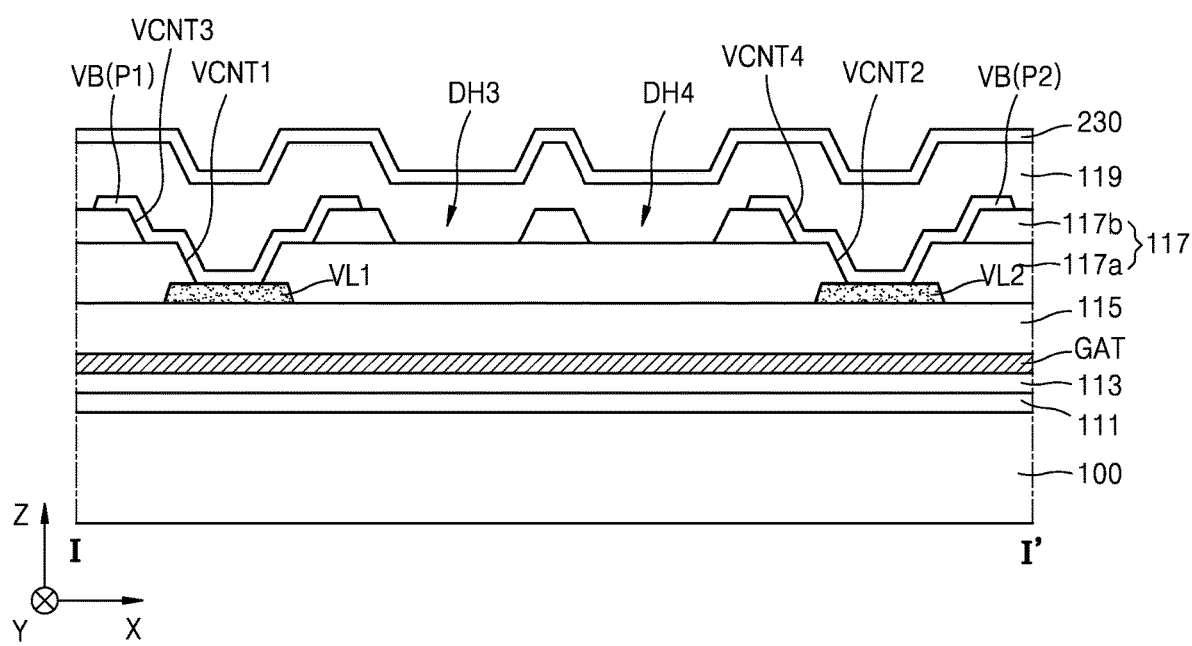

FIGS. 7A, 7B, and 7C are exemplary cross-sectional views of the bridge wiring of FIG. 4 taken along line I-I'. In FIGS. 7A, 7B, and 7C, the same reference numerals as in FIGS. 5A and 5B denote the same members, and duplicate descriptions thereof will be omitted.

Referring to FIGS. 7A, 7B, and 7C, the organic film layer 117 may include a first organic film layer 117a and a second organic film layer 117b, which are sequentially arranged. It may be understood that the first organic film layer 117a may correspond to the organic film layer 117 shown in FIGS. 5A, 5B, and 6, and that the second organic film layer 117b is arranged on the first organic film layer 117a separately from the first organic film layer 117a.

As such, when the first organic film layer 117a and the second organic film layer 117b are sequentially arranged such that the organic film layer 117 forms a double layer, the flatness of the organic film layer 117 may increase. Therefore, the pixel electrode 210 arranged on the organic film layer 117 does not form a step or the like, due to the organic film layer 117. When the external light is reflected from the surface of the pixel electrode, it may be shifted in one direction due to a step difference, or the like. In this case, a color separation phenomenon in which a specific color is emphasized (e.g., relatively intensified or prominent) may occur depending on the location where an emission area is formed. However, when the organic film layer 117 forms a double layer, the flatness of the organic film layer 117 increases, and the pixel electrode 210 does not form a step or the like due to the organic film layer 117. Therefore, the color separation phenomenon due to external light may be reduced.

The first organic film layer 117a and the second organic film layer 117b may be formed of a single layer or multiple layers of an organic material, and provide a flat top surface. The organic film layer 117 may be a general-purpose polymer, such as benzocyclobutene (BCB), polyimide, hexamethyldisiloxane (HMDSO), poly(methyl methacrylate) (PMMA), or polystyrene (PS), or may be a polymer derivative having a phenolic group, an acrylic polymer, imide polymers, aryl ether polymers, amide polymers, fluorine polymers, p-xylene polymers, vinyl alcohol polymers, and blends thereof.

The first organic film layer 117a may have the first initialization contact hole VCNT1 that connects the first portion P1 of the first initialization bridge wiring VB arranged in the peripheral area PA to the first initialization voltage line VL1, and may have the second initialization contact hole VCNT2 that connects the second portion P2 of the initialization bridge wiring VB arranged in the peripheral area PA to the second initialization voltage line VL2. The second organic film layer 117b may have a third initialization contact hole VCNT3 corresponding to the first initialization contact hole VCNT1, and a fourth initialization contact hole VCNT4 corresponding to the second initialization contact hole VCNT2.

In an embodiment, as illustrated in FIG. 7A, the second organic film layer 117b corresponding to the peripheral area PA may have a first dummy hole DH1 adjacent to each of the third initialization contact hole VCNT3 and fourth initialization contact hole VCNT4. In other words, the second organic film layer 117b may have the first dummy hole DH1 corresponding to portions of the peripheral area PA surrounding the third initialization contact hole VCNT3 and the fourth initialization contact hole VCNT4.

The first dummy hole DH1 formed in the second organic film layer 117b may be arranged between portions of the initialization bridge wiring VB, each of the portions of the initialization bridge wiring VB extending in the +Y direction. For example, the first dummy hole DH1 may be arranged between the first portion P1 of the initialization bridge wiring VB and the second portion P2 of the initialization bridge wiring VB. As such, the volume of the organic matter in the display apparatus 1 is reduced, and thus, the outgassing of the organic matter may be significantly reduced.

In an embodiment, as illustrated in FIG. 7B, the first organic film layer 117a may have a second dummy hole DH2 corresponding to the first dummy hole DH1 formed in the second organic film layer 117b. In this case, the volume of organic matter in the display apparatus 1 is reduced as compared to when only the second organic film layer 117b has the first dummy hole DH1, and thus, the outgassing of organic matter may be significantly reduced.

In an embodiment, as illustrated in FIG. 7C, the second organic film layer 117b corresponding to the peripheral area PA may have a third dummy hole DH3 and a fourth dummy hole DH4 respectively adjacent to the third initialization contact hole VCNT3 and the fourth initialization contact hole VCNT4. In other words, the second organic film layer 117b may have the third dummy hole DH3 and the fourth dummy hole DH4 corresponding to portions of the peripheral area PA respectively surrounding the third initialization contact hole VCNT3 and the fourth initialization contact hole VCNT4.

The third dummy hole DH3 and the fourth dummy hole DH4, which are formed in the second organic film layer 117b, may be arranged between portions of the initialization bridge wiring VB, each of the portions of the initialization bridge wiring VB extending in the +Y direction. For example, the third dummy hole DH3 and the fourth dummy hole DH4 may be arranged between the first portion P1 of the initialization bridge wiring VB and the second portion P2 of the initialization bridge wiring VB. FIG. 7C illustrates that a total of two dummy holes are formed between the first portion P1 and the second portion P2 of the initialization bridge wiring VB; however, the number of dummy holes may be different than two. For example, a total of four dummy holes may be formed in the second organic film layer 117b. In addition, as described above with reference to FIG. 7B, the first organic film layer 117a may include dummy holes corresponding to the dummy holes formed in the second organic film layer 117b.

Through various embodiments of the disclosure, the volume of the organic material in the display apparatus 1 may be reduced, and outgassing of the organic material may be significantly reduced so that defects such as pixel shrinkage due to outgassing may be prevented or substantially reduced. The reliability of the display apparatus 1 may be improved.

According to one or more embodiments of the disclosure, the volume of the organic matter in a display apparatus is reduced, and thus, the outgassing of the organic matter may be significantly reduced. Therefore, even if the display apparatus is exposed to sunlight for a long time, it is possible to prevent or significantly reduce decomposition of organic matter by sunlight, so that the reliability of the display apparatus may be improved. The scope of the disclosure is not limited by these effects.

So far, the display apparatus has been mainly described, but the disclosure is not limited thereto. For example, for manufacturing such a display apparatus, methods of manufacturing a display apparatus also fall within the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims and equivalents thereof.

What is claimed is:

1. A display apparatus comprising:
   a substrate having a display area and a peripheral area surrounding the display area;
   a first initialization voltage line on the substrate;
   an organic film layer on the first initialization voltage line and having a first contact hole exposing at least a portion of the first initialization voltage line;
   a bridge wiring on the organic film layer corresponding to the peripheral area, and in contact with the first initialization voltage line through the first contact hole;
   an insulating layer on the organic film layer and comprising an organic insulating material; and
   a plurality of pixels on the display area and each receiving an initialization voltage,
   wherein the organic film layer corresponding to the peripheral area has a groove or dummy hole, the groove or the dummy hole being adjacent to the first contact hole,
   wherein the insulating layer contacts the bridge wiring and walls of the groove or the dummy hole.

2. The display apparatus of claim 1, further comprising:
   a second initialization voltage line on a same layer as the first initialization voltage line,
   wherein the organic film layer further has a second contact hole exposing the second initialization voltage line at least partially, and
   wherein the bridge wiring is in contact with the second initialization voltage line through the second contact hole.

3. The display apparatus of claim 2, wherein the bridge wiring comprises a first portion extending in a first direction and in contact with the first initialization voltage line, and a second portion extending in the first direction and in contact with the second initialization voltage line.

4. The display apparatus of claim 3, wherein the groove or the dummy hole is between the first portion and the second portion.

5. The display apparatus of claim 1, wherein the bridge wiring at least partially overlaps the groove, and comprises a step portion corresponding to the groove.

6. The display apparatus of claim 5, wherein a vertical distance from the substrate to a portion of an upper surface of the bridge wiring overlapping the groove is less than a vertical distance from the substrate to another portion of the upper surface of the bridge wiring other than the portion overlapping the groove.

7. The display apparatus of claim 1, further comprising a connection wiring on a same layer as the bridge wiring.

8. The display apparatus of claim 7, wherein the bridge wiring is integrated with the connection wiring.

9. The display apparatus of claim 7, wherein, from a plan view, the connection wiring is bent at least twice.

10. A display apparatus comprising:
a substrate has a display area and a peripheral area surrounding the display area;
a first initialization voltage line on the substrate;
a first organic film layer on the first initialization voltage line and having a first contact hole exposing at least a portion of the first initialization voltage line;
a second organic film layer on the first organic film layer and comprising a third contact hole corresponding to the first contact hole;
a bridge wiring on the second organic film layer corresponding to the peripheral area, and in contact with the first initialization voltage line;
an insulating layer on the first organic film layer and comprising an organic insulating material; and
a plurality of pixels on the display area and each receiving an initialization voltage,
wherein the second organic film layer corresponding to the peripheral area has a first dummy hole adjacent to the first contact hole and the third contact hole,
wherein the insulating layer contacts the bridge wiring and walls of the first dummy hole.

11. The display apparatus of claim 10, wherein the first organic film layer has a second dummy hole corresponding to the first dummy hole.

12. The display apparatus of claim 10, further comprising:
a second initialization voltage line on a same layer as the first initialization voltage line,
wherein the first organic film layer further has a second contact hole exposing the second initialization voltage line at least partially,
wherein the second organic film layer further comprises a fourth contact hole corresponding to the second contact hole, and
wherein the bridge wiring contacts the second initialization voltage line through the second contact hole and the fourth contact hole.

13. The display apparatus of claim 12, wherein the bridge wiring comprises a first portion extending in a first direction and in contact with the first initialization voltage line, and a second portion extending in the first direction and in contact with the second initialization voltage line, and
the first dummy hole is between the first portion and the second portion.

14. The display apparatus of claim 13, wherein the second organic film layer further has a third dummy hole spaced from the first dummy hole and between the first portion and the second portion.

15. The display apparatus of claim 10, further comprising a connection wiring on a same layer as the bridge wiring.

16. The display apparatus of claim 15, further comprising a light-emitting device spaced, from a plan view, from the bridge wiring with the connection wiring therebetween, and arranged to correspond to the display area.

17. The display apparatus of claim 16, wherein the light-emitting device comprises:
a pixel electrode on a same layer as the bridge wiring;
an intermediate layer on the pixel electrode; and
an opposite electrode on the intermediate layer.

18. A display apparatus comprising:
a substrate has a display area and a peripheral area surrounding the display area;
a voltage wiring on the substrate;
a first organic film layer on the voltage wiring and having a first contact hole exposing at least a portion of the voltage wiring;
a second organic film layer on the first organic film layer and having a third contact hole corresponding to the first contact hole;
a bridge wiring on the second organic film layer corresponding to the peripheral area, and in contact with the voltage wiring;
an insulating layer on the first organic film layer and comprising an organic insulating material,
wherein the second organic film layer corresponding to the peripheral area has a dummy hole adjacent to the first contact hole and the third contact hole,
wherein the insulating layer contacts the bridge wiring and walls of the dummy hole, and
wherein a vertical distance from the substrate to a top surface of the dummy hole is greater than that from the substrate to a top surface of the voltage wiring.

19. The display apparatus of claim 18, further comprising:
a plurality of pixels on the display area and each receiving a first scan signal, a second scan signal, a third scan signal, a data voltage, and an initialization voltage,
wherein each one of the plurality of pixels comprises:
a light-emitting device;
a driving thin-film transistor configured to control a magnitude of current flowing through the light-emitting device based on a gate-source voltage;
a storage capacitor between a power line and a gate of the driving thin-film transistor;
a scan thin-film transistor configured to transmit the data voltage to a source of the driving thin-film transistor, in response to the second scan signal;
a compensation thin-film transistor configured to connect a drain of the driving thin-film transistor to the gate of the driving thin-film transistor, in response to the second scan signal;
a gate initialization thin-film transistor configured to apply the initialization voltage to the gate of the driving thin-film transistor, in response to the first scan signal; and
an anode initialization thin-film transistor configured to apply the initialization voltage to an anode of the light-emitting device, in response to the third scan signal.

20. The display apparatus of claim 19, wherein the voltage wiring is an initialization voltage line configured to transmit the initialization voltage to each of the plurality of pixels.

* * * * *